United States Patent
Shen et al.

(10) Patent No.: US 11,380,603 B2
(45) Date of Patent: Jul. 5, 2022

(54) METHOD FOR MAKING A HEAT DISSIPATION STRUCTURE

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Fu-Yun Shen, Shenzhen (CN); Cong Lei, Huaian (CN); Ming-Jaan Ho, New Taipei (TW); Hsiao-Ting Hsu, New Taipei (TW)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 520 days.

(21) Appl. No.: 16/596,250

(22) Filed: Oct. 8, 2019

(65) Prior Publication Data

US 2020/0043827 A1    Feb. 6, 2020

Related U.S. Application Data

(62) Division of application No. 15/615,065, filed on Jun. 6, 2017, now Pat. No. 10,658,265.

(30) Foreign Application Priority Data

Sep. 18, 2016 (CN) .......................... 201610830252.6

(51) Int. Cl.
*H05K 1/02* (2006.01)
*H05K 5/00* (2006.01)
(Continued)

(52) U.S. Cl.
CPC ......... *H01L 23/3736* (2013.01); *H01B 17/54* (2013.01); *H01L 23/36* (2013.01);
(Continued)

(58) Field of Classification Search
CPC .. H05K 1/02; H05K 5/00; H05K 5/02; H05K 5/022; H05K 5/06; H05K 5/069;
(Continued)

(56) References Cited

U.S. PATENT DOCUMENTS 11,229,130 B2 * 1/2022 Wu ...................... H05K 7/2039
2011/0045300 A1 * 2/2011 Tamaoki ................. C01B 32/21
156/60

(Continued)

FOREIGN PATENT DOCUMENTS

CN    105283040 A    1/2016
CN    105764299 A    7/2016

*Primary Examiner* — Xiaoliang Chen
(74) *Attorney, Agent, or Firm* — ScienBiziP, P.C.

(57) ABSTRACT

An electronic device includes a heat dissipation structure. The heat dissipation structure comprises a flexible substrate, a graphite sheet, and a heat insulating material. The flexible substrate comprises a first surface and a second surface facing away from the first surface. The flexible substrate is disposed on the graphite sheet, and the second surface faces the graphite sheet. At least one containing cavity is formed between the flexible substrate and the graphite sheet. The heat insulating material is filled in the containing cavity. A cover plate is disposed on the first surface. At least one groove is formed on the flexible substrate from the first surface to the second surface. The groove is sealed by the cover plate to formed a sealed cavity. A phase changing material is filled in the sealed cavity.

10 Claims, 9 Drawing Sheets

(51) Int. Cl.
*H05K 5/02* (2006.01)
*H05K 5/06* (2006.01)
*H05K 7/20* (2006.01)
*H01L 23/34* (2006.01)
*H01L 23/36* (2006.01)
*H01L 23/367* (2006.01)
*H01L 23/373* (2006.01)
*H01L 23/427* (2006.01)
*H01B 17/54* (2006.01)
*H05K 3/00* (2006.01)
*H01B 7/42* (2006.01)

(52) U.S. Cl.
CPC ........ H01L 23/373 (2013.01); H01L 23/4275 (2013.01); H05K 7/20 (2013.01); *H01B 7/428* (2013.01); *H05K 3/005* (2013.01); *H05K 3/0011* (2013.01); *H05K 3/0017* (2013.01); *H05K 3/0026* (2013.01)

(58) Field of Classification Search
CPC ...... H05K 5/0213; H05K 7/20; H05K 7/2039; H01L 23/34; H01L 23/36; H01L 23/367; H01L 23/3672; H01L 23/3731; H01L 23/3735; H01L 23/3736
USPC .......................... 361/746, 720; 428/140, 408
See application file for complete search history.

(56) References Cited

U.S. PATENT DOCUMENTS

| | | | |
|---|---|---|---|
| 2015/0190982 A1* | 7/2015 | Kutsumizu | H01L 23/3735 428/140 |
| 2015/0214411 A1* | 7/2015 | Guerra | C25B 11/03 204/252 |
| 2016/0143128 A1* | 5/2016 | Tsunoda | H01L 23/3672 361/720 |
| 2016/0285141 A1* | 9/2016 | Sakaguchi | H01M 10/617 |
| 2016/0324031 A1* | 11/2016 | Fujiwara | B32B 9/007 |

* cited by examiner

METHOD FOR MAKING A HEAT DISSIPATION STRUCTURE

CROSS-REFERENCE TO RELATED APPLICATIONS

This is a divisional application of patent application Ser. No. 15/615,065 filed on Jun. 6, 2017, which is based on and claims priority to China Patent Application No. 201610830252.6 filed on Sep. 18, 2016, the contents of which are incorporated by reference herein.

FIELD

The subject matter herein generally relates to a method for making a heat dissipation structure, and an electronic device having the heat dissipation structures.

BACKGROUND

Electronic devices usually comprise electronic elements (such as central processing units (CPUs)) which may generate heat when in operation. Heat sinks are usually used in the electronic devices for dissipating the heat generated by the electronic elements. However, the temperature of a portion of the heat sink near a heat source of the electronic element is always larger than temperatures of other portions of the heat sink away from the heat source, causing the electronic device to have uneven temperatures.

BRIEF DESCRIPTION OF THE DRAWINGS

Implementations of the present technology will now be described, by way of example only, with reference to the attached figures.

DETAILED DESCRIPTION

Figure 1:
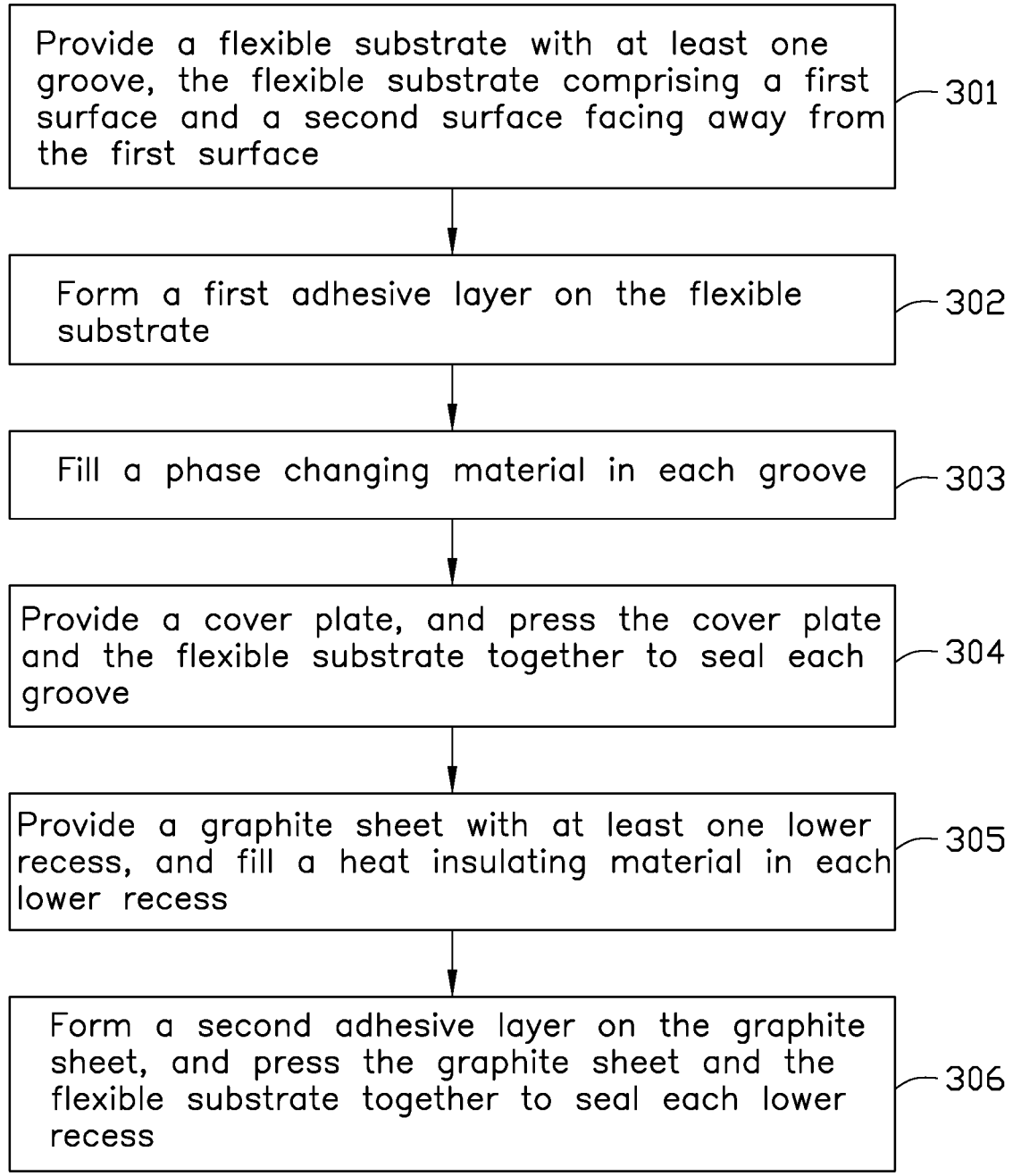
FIG. 1 is a flowchart of a first exemplary embodiment of a method for making a heat dissipation structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" when utilized, means "including, but not necessarily limited to"; it specifically indicates open-ended inclusion or membership in the so-described combination, group, series and the like.

FIG. 1 illustrates a flowchart is presented in accordance with a first exemplary embodiment. The first exemplary method for making a heat dissipation structure 100 (shown in FIG. 10) is provided by way of example only, as there are a variety of ways to carry out the method. Each block shown in FIG. 1 represents one or more processes, methods or subroutines, carried out in the first exemplary method. Furthermore, the illustrated order of blocks is by example only and the order of the blocks can be changed. Additional blocks may be added or fewer blocks may be utilized, without departing from this disclosure. The first exemplary method can begin at block 301.

Figure 2:
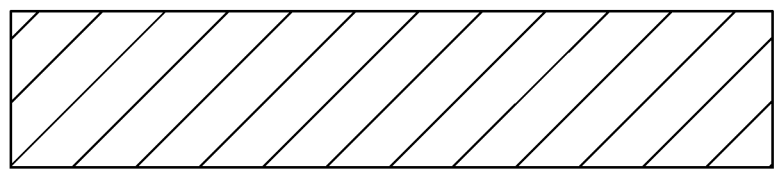
FIG. 2 is a cross-sectional view of a flexible substrate used in the method of FIG. 1.
Figure 3:
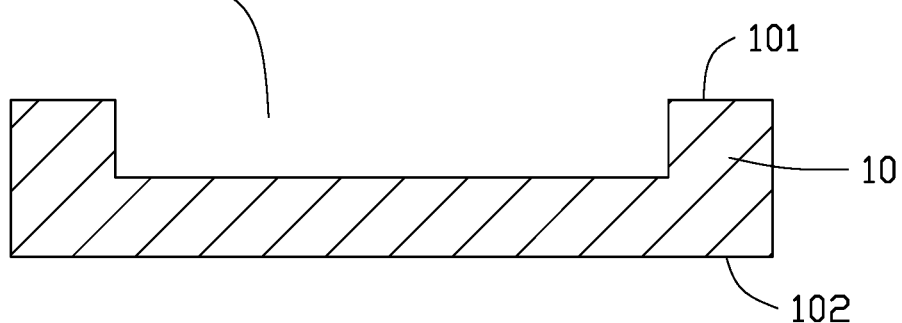
FIG. 3 is a cross-sectional view showing at least one groove being defined in the flexible substrate of FIG. 2.

At block 301, referring to FIGS. 2 and 3, a flexible substrate 10 is provided, and at least one groove 11 is defined in the flexible substrate 10.

The flexible substrate 10 comprises a first surface 101 and a second surface 102 facing away from the first surface 101.

In the first exemplary embodiment, the flexible substrate 10 is made of copper, and has a thickness of about 18 μm to about 175 μm. In another exemplary embodiment, the flexible substrate 10 may be made of other materials which are resistant to thermal deformation, such as aluminum or silver. A thickness of the flexible substrate 10 can be selected according to the specific need of a particular application.

Each groove 11 is defined from the first surface 101 toward the second surface 102 by, for example, etching. In another exemplary embodiment, each groove 11 can be defined by mechanical cutting, laser cutting, or punching.

In the first exemplary embodiment, each groove 11 is substantially square when seen from a top plan view. In another exemplary embodiment, each groove 11 may be substantially circular, rectangular, polygonal, or trapezoidal when seen from a top plan view.

In another exemplary embodiment, an inner surface of each groove 11 can be micro-etched to form wick structures.

Figure 4:
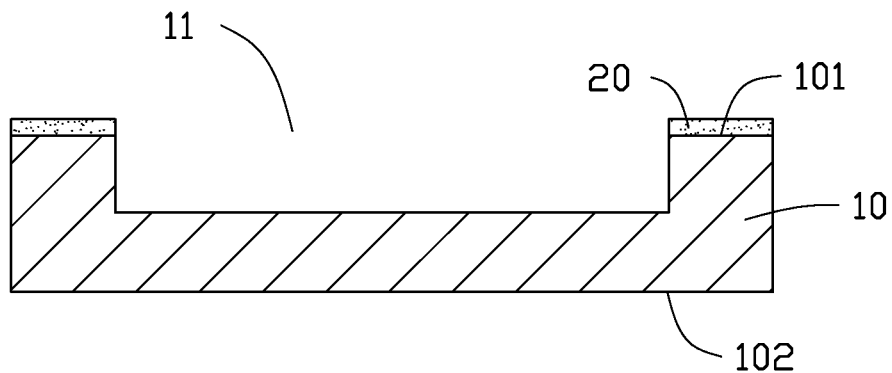
FIG. 4 is a cross-sectional view showing a first adhesive layer being formed on the flexible substrate of FIG. 3.

At block 302, referring to FIG. 4, a first adhesive layer 20 is formed on the first surface 101 to surround each groove 11. The first adhesive layer 20 is made of materials having a heat conducting capability, and is formed on the first surface 101 by coating, fluid dispensing, or printing.

Figure 5:
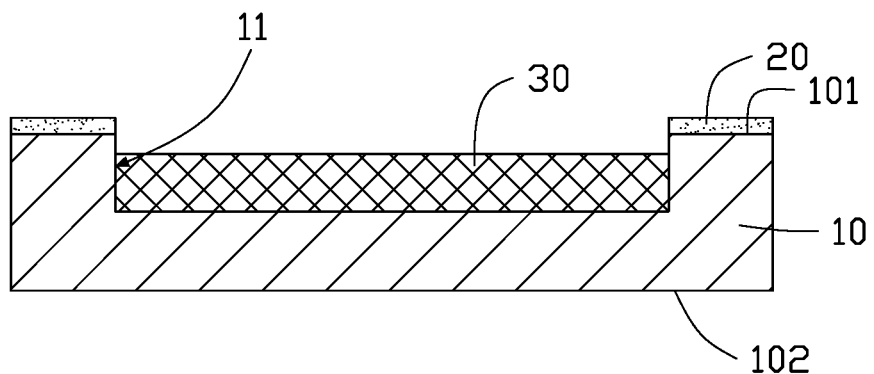
FIG. 5 is a cross-sectional view showing a phase changing material being filled in each groove of FIG. 4.

At block 303, referring to FIG. 5, a phase changing material 30 is filled in each groove 11. The phase changing material 30 may include paraffin, polyethylene glycol 1000 (PEG 1000), lauric acid, or any combination thereof.

Figure 6:
FIG. 6 is a cross-sectional view of a cover plate used in the method of FIG. 1.
Figure 7:
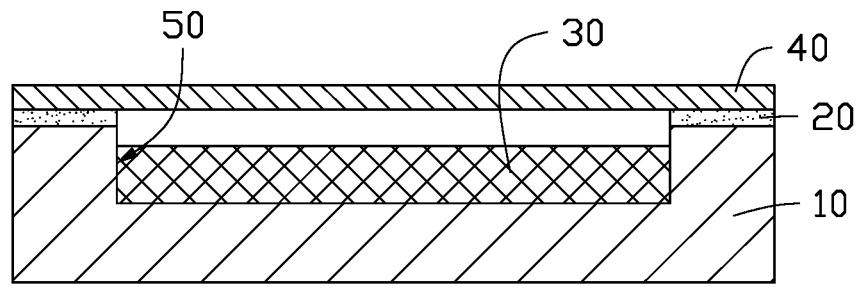
FIG. 7 is a cross-sectional view showing each groove with the phase changing material being sealed by the cover plate of FIG. 5.

At block 304, referring to FIGS. 6 and 7, a cover plate 40 is provided, then the cover plate 40 and the flexible substrate 10 with the phase changing material 30 are pressed, causing the cover plate 40 to be connected to the flexible substrate 10 by the first adhesive layer 20. As such, each groove 11 is sealed by the cover plate 40 to define a sealed cavity 50. The phase changing material 30 is filled in each sealed cavity 50.

In the first exemplary embodiment, the cover plate 40 is made of copper. In another exemplary embodiment, the cover plate 40 may be made of other materials which are resistant to thermal deformation, such as aluminum or silver.

Figure 8:
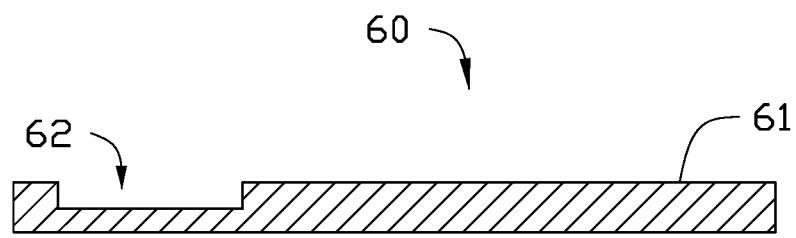
FIG. 8 is a cross-sectional view of a graphite sheet with at least one lower recess.

At block 305, referring to FIG. 8, a graphite sheet 60 is provided which defines at least one lower recess 62 on a third surface 61 of the graphite sheet 60. The heat insulating material may include air, polyimide resin, polyester resin, asbestos, polypropylene resin, or any combination thereof.

Each lower recess 62 can be defined by etching, mechanical cutting, or laser cutting. In the first exemplary embodiment, each lower recess 62 is substantially circular when see from a top plan view. In another exemplary embodiment, each lower recess 62 may be substantially square, rectangular, polygonal, or trapezoidal when see from a top plan view.

Figure 9:
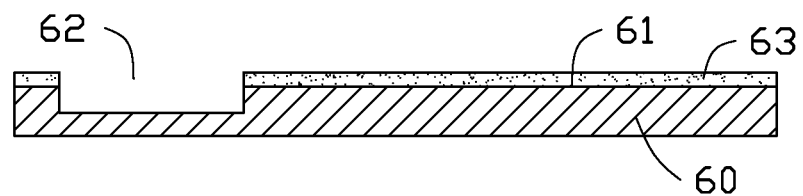
FIG. 9 is a cross-sectional view showing a second adhesive layer being formed on the graphite sheet of FIG. 8.
Figure 10:
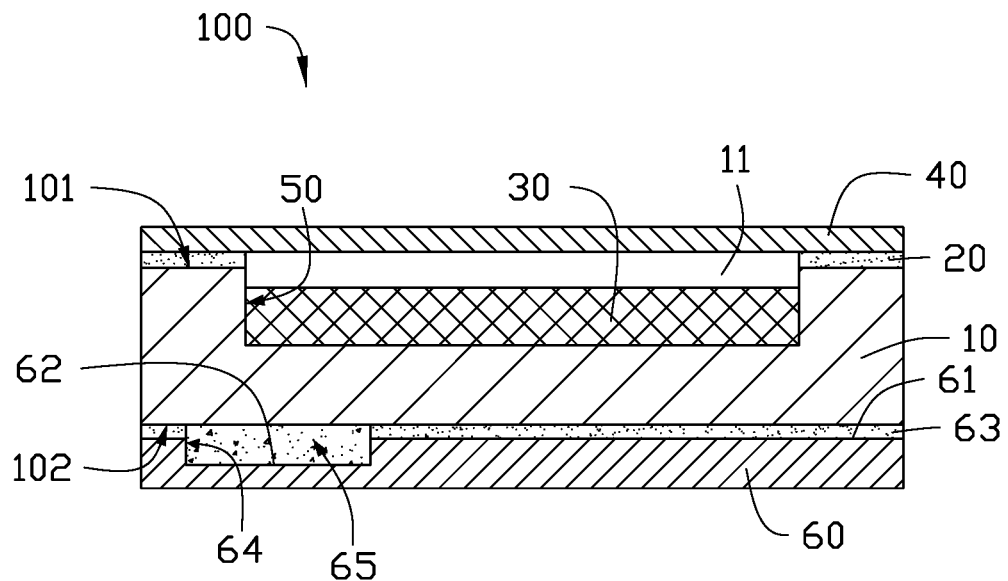
FIG. 10 is a cross-sectional view showing the graphite sheet of FIG. 9 being connected to the flexible substrate of FIG. 7 to form a heat dissipation structure.

At block 306, referring to FIGS. 9 and 10, a second adhesive layer 63 is formed on the third surface 61 of the graphite sheet 60 to surround the lower recess 62, and a heat insulating material is filled in each lower recess 62, then the graphite sheet 60 and the flexible substrate 10 are pressed, causing the graphite sheet 60 to be connected to the second surface 102 of the flexible substrate 10 by the second adhesive layer 63. Each lower recess 62 is sealed by the flexible substrate 10 to define a containing cavity 64. It should be noted that a heat insulating material is filled in the containing cavity 64 to form a heat insulating structure 65. The adhesive layer 63 is made of materials having a heat conducting capability.

Figure 11:
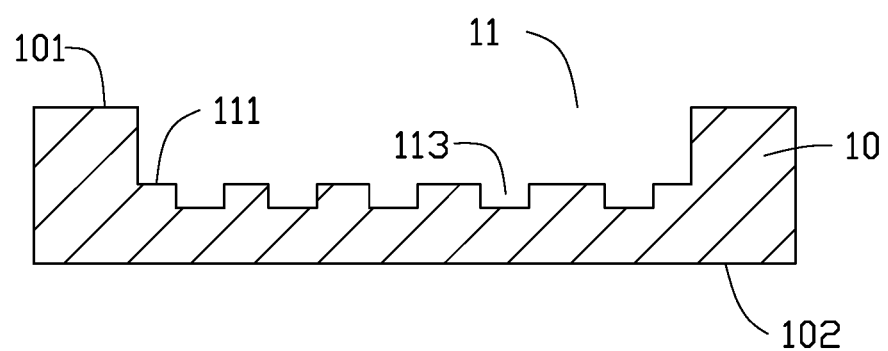
FIG. 11 is similar to FIG. 3, but showing a plurality of microgrooves being defined at a bottom of each groove.
Figure 12:
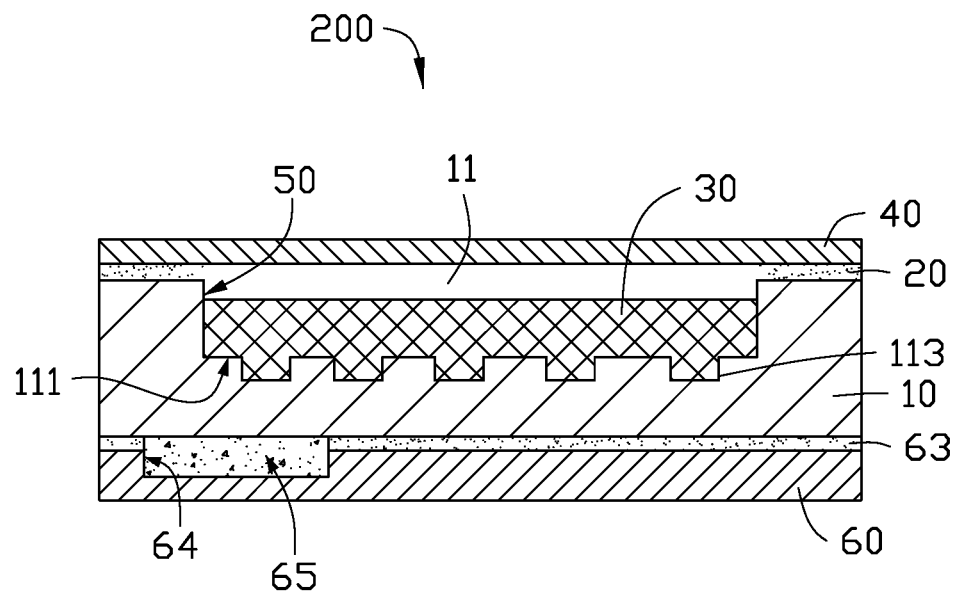
FIG. 12 is a cross-sectional view of a second exemplary embodiment of a heat insulating structure, using the flexible substrate of FIG. 11.

Referring to FIGS. 11 and 12, in a second exemplary embodiment, at block 301, a plurality of microgrooves 113 is further defined at a bottom 111 of each groove 11. Sizes and/or shapes of the microgrooves 113 may be the same or be different.

Figure 13:
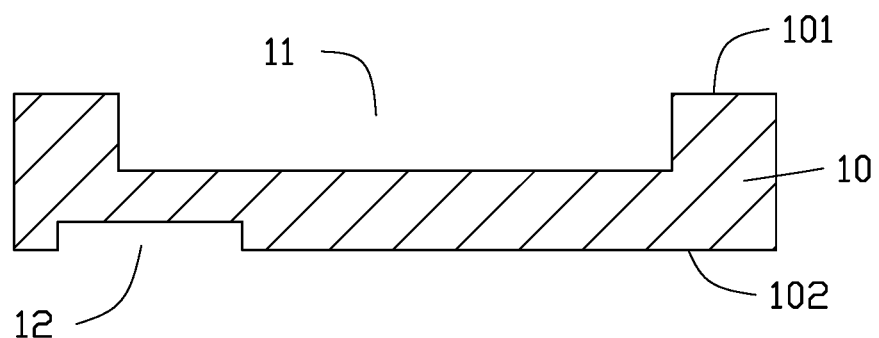
FIG. 13 is similar to FIG. 3, but showing at least one upper recess being defined in the flexible substrate.
Figure 14:
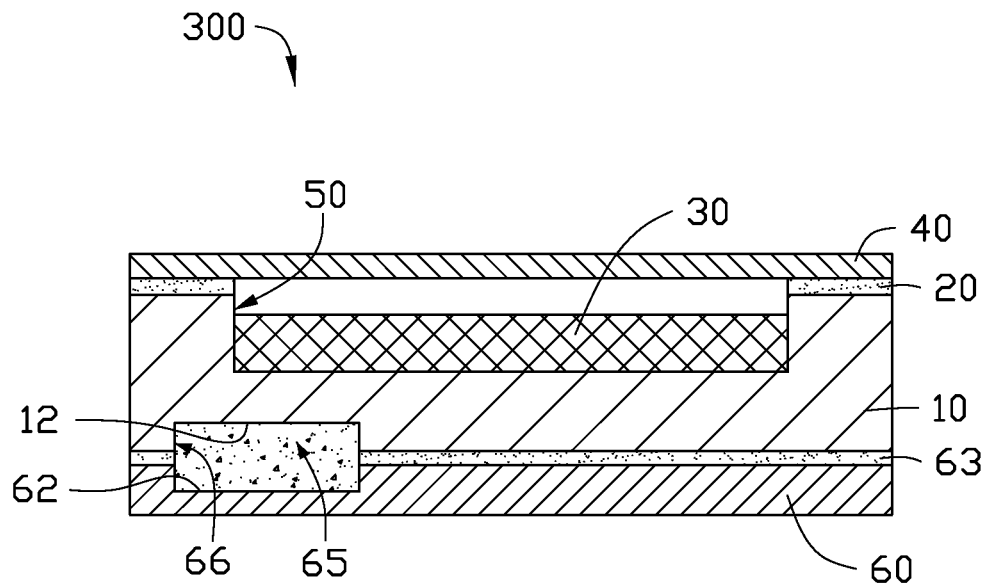
FIG. 14 is a cross-sectional view of a third exemplary embodiment of a heat insulating structure, using the flexible substrate of FIG. 13.

Referring to FIGS. 13 and 14, in a third exemplary embodiment, at block 301, at least one upper recess 12 is further defined at the second surface 102 which extends toward the first surface 101. Each upper recess 12 faces one lower recess 62 when the graphite sheet 60 and the flexible substrate 10 are pressed at block 306. In this embodiment, the containing cavity 66 is formed by the upper recess 12 and the lower recess 62. The heat insulating material is filled in the containing cavity 66 to form the heat insulating structure 65.

Figure 15:
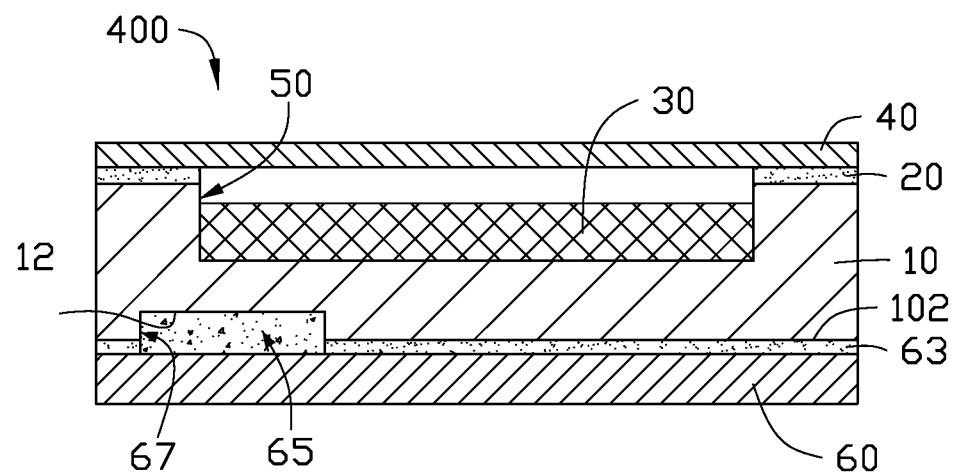
FIG. 15 is a cross-sectional view of a fourth exemplary embodiment of a heat insulating structure.

Referring to FIG. 15, in a fourth exemplary embodiment, the graphite sheet 60 defines no lower recess 62, so that the containing cavity 67 is formed by the sealing the upper recess 12 by the graphite sheet 60 at block 306. The heat insulating material is filled in the containing cavity 67 to form the heat insulating structure 65.

FIG. 10 illustrates that in the first exemplary embodiment, the heat dissipation structure 100 comprises a flexible substrate 10, a phase changing material 30, a cover plate 40, and a graphite sheet 60.

The flexible substrate 10 comprises a first surface 101 and a second surface 102 facing away from the first surface 101. At least one groove 11 is defined at the first surface 101 toward the second surface 102.

In the first exemplary embodiment, the flexible substrate 10 is made of copper, and has a thickness of about 18 μm to about 175 μm. In another exemplary embodiment, the flexible substrate 10 may be made of other materials which are resistant to thermal deformation, such as aluminum or silver. A thickness of the flexible substrate 10 can be selected according to the specific need of a particular application.

In the first exemplary embodiment, each groove 11 is substantially square when seen from a top plan view. In another exemplary embodiment, each groove 11 may be substantially circular, rectangular, polygonal, or trapezoidal when seen from a top plan view.

The cover plate 40 is connected to the first surface 101 of the flexible substrate 10 by a first adhesive layer 20, the first adhesive layer 20 surrounding each groove 11. Each groove 11 is sealed by the cover plate 40 to define a sealed cavity 50. The first adhesive layer 20 is made of materials having a heat conducting capability, and is formed by coating, fluid dispensing, or printing.

In the first exemplary embodiment, the cover plate 40 is made of copper. In another exemplary embodiment, the cover plate 40 may be made of other materials that are resistant to thermal deformation, such as aluminum or silver.

The phase changing material 30 is filled in each sealed cavity 50. The phase changing material 30 may include paraffin, polyethylene glycol 1000 (PEG 1000), lauric acid, or any combination thereof.

In another exemplary embodiment, wick structures can be formed at an inner surface of each groove 11.

At least one lower recess 62 is defined at a third surface 61 of the graphite sheet 60. The third surface 61 of the graphite sheet 60 is connected to the second surface 102 of the flexible substrate 10 through a second adhesive layer 63, so that the recess 62 is sealed by the flexible substrate 10 to define a containing cavity 64. A heat insulating material is filled in each containing cavity 64 to form a heat insulating structure 65. The heat insulating material may include air, polyimide resin, polyester resin, asbestos, polypropylene resin, or any combination thereof.

Each lower recess 62 is substantially circular when seen from a top plan view. In another exemplary embodiment, each lower recess 62 may be substantially square, rectangular, polygonal, or trapezoidal when seen from a top plan view.

FIG. 12 illustrates a second exemplary embodiment of a heat dissipation structure 200. Different from the first exemplary embodiment, a plurality of microgrooves 113 is defined at a bottom 111 of each groove 11. Sizes and/or shapes of the microgrooves 113 may be the same or be different.

In the second exemplary embodiment shown in FIG. 12, areas of the microgrooves 113 on the bottom 111 decrease along a direction from a position at the bottom 111 near the containing cavity 64 to other positions at the bottom 111 away from the containing cavity 64. More specifically, the widths of the microgrooves 113 are the same. Distribution densities of the microgrooves 113 decrease from a position at the bottom 111 near the containing cavity 64 to other positions at the bottom 111 away from the containing cavity 64.

FIG. 14 illustrates a third exemplary embodiment of a heat dissipation structure 300. Different from the first exemplary embodiment, at least one upper recess 12 is defined at the second surface 102 which extends toward the first surface 101. Each upper recess 12 faces a corresponding lower recess 62 to define the containing cavity 66.

FIG. 15 illustrates a fourth exemplary embodiment of a heat dissipation structure 400. Different from the third exemplary embodiment, the graphite sheet 60 has no lower recess 62, so that each upper recess 12 is sealed by the graphite sheet 60 to define the containing cavity 67.

Figure 16:
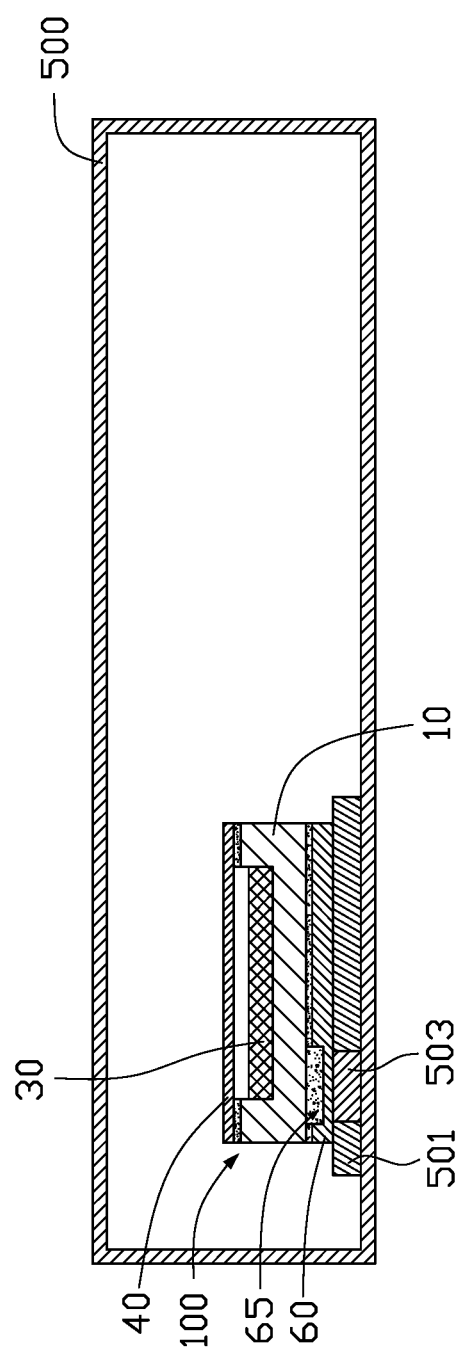
FIG. 16 is a cross-sectional view of an electronic device using a heat insulating structure.

As shown in FIG. 16, when in operation, the graphite sheet 60 contacts an electronic element 501 (such as CPU) of an electronic device 500, which needs to dissipate heat. The heat insulating structure 65 contacts a heat source 503 (such as circuit board) of the electronic element 501. The graphite sheet 60 absorbs the heat from the heat source 503. The absorbed heat is dissipated towards different directions by the graphite sheet 60, and is conducted to the flexible substrate 10 through the heat insulating structure 65 and the graphite sheet 60. Then, the heat is dissipated to an ambient environment through the flexible substrate 10, the phase changing material 30, and the cover plate 40. Because the heat insulating structure 65 contacts the heat source 503 of the electronic element 501, a conducting speed of the heat is reduced at the heat insulating structure 65, to cause most of the absorbed heat to be conducted along an extending (e.g., longitudinal) direction of the graphite sheet 60. Therefore, the heat can be dissipated uniformly, to cause a temperature of the electronic device 500 to be uniformly decreased.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for making a heat dissipation structure comprising:
   providing a flexible substrate and a graphite sheet, the flexible substrate comprising a first surface and a second surface facing away from the first surface, the graphite sheet comprising a third surface and a fourth surface facing away from the third surface;
   forming at least one recess on at least one the flexible substrate and the graphite sheet, the at least one recess is recessed from the second surface of the flexible substrate to the first surface of the flexible substrate, and/or recessed from the third surface of the graphite sheet to the fourth surface of the graphite sheet;
   forming at least one groove on the flexible substrate from the first surface of the flexible substrate to the second surface of the flexible substrate;
   filling a heat insulating material in the at least one recess;
   filling a phase changing material in the at least one groove;
   connecting a cover plate to the first surface of the flexible substrate, thereby sealing the at least one groove to define a sealed cavity; and
   connecting the second surface of the flexible substrate to the third surface of the graphite sheet to seal the at least one recess to define a containing cavity, to cause a heat insulating material to be sealed in the containing cavity.

2. The method for making a heat dissipation structure of the claim 1, before connecting the second surface of the flexible substrate to the third surface of the graphite sheet, the method for making a heat dissipation structure further comprising forming an adhesive layer on the first surface to surround each of the least one groove; when connecting the second surface of the flexible substrate to the third surface of the graphite sheet, the adhesive layer binds the cover plate and the graphite sheet.

3. The method for making a heat dissipation structure of the claim 1, the flexible substrate further comprises a bottom surface and a side wall surrounding the bottom surface; the side wall, the bottom surface and the cover plate cooperate to form the sealed cavity; the method for making a heat dissipation structure further comprising:
   forming a plurality of microgrooves in the flexible substrate from the bottom surface to the second surface of the flexible substrate and in communication with the sealed cavity, areas of the microgrooves on the bottom surface decreasing along a direction from a position at the bottom surface near the containing cavity to other positions at the bottom surface away from the containing cavity.

4. The method for making a heat dissipation structure of the claim 1, wherein the heat insulating material is selected from a group consisting of air, polyimide resin, polyester resin, asbestos, and polypropylene resin.

5. The method for making a heat dissipation structure of the claim 1, wherein the flexible substrate has a thickness of about 18 μm to about 175 μm.

6. The method for making a heat dissipation structure of the claim 1, wherein the at least one groove is formed by etching, mechanical cutting, laser cutting, or punching.

7. The method for making a heat dissipation structure of the claim 1, wherein the phase changing material comprises paraffin, polyethylene glycol 1000, lauric acid, or any combination thereof.

8. The method for making a heat dissipation structure of the claim 1, wherein the cover plate is connected to the first surface of the flexible substrate by an adhesive layer.

9. The method for making a heat dissipation structure of the claim 8, wherein the adhesive layer is formed on the first surface to surround each groove.

10. The method for making a heat dissipation structure of the claim 8, wherein the adhesive layer is made of materials having a heat conducting capability.

\* \* \* \* \*